United States Patent
Ali

(10) Patent No.: US 7,192,877 B2
(45) Date of Patent: Mar. 20, 2007

(54) LOW-K DIELECTRIC ETCH PROCESS FOR DUAL-DAMASCENE STRUCTURES

(75) Inventor: Abbas Ali, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 159 days.

(21) Appl. No.: 10/851,263

(22) Filed: May 21, 2004

(65) Prior Publication Data
US 2005/0260845 A1 Nov. 24, 2005

(51) Int. Cl.
*H01L 21/302* (2006.01)
*H01L 21/461* (2006.01)

(52) U.S. Cl. ............................ 438/734; 257/E21.579
(58) Field of Classification Search ............... 438/734
See application file for complete search history.

(56) References Cited
U.S. PATENT DOCUMENTS

| 6,548,901 B1 * | 4/2003 | Cote et al. ............... 257/758 |
| 6,569,777 B1 * | 5/2003 | Hsu et al. ............... 438/725 |
| 6,649,531 B2 * | 11/2003 | Cote et al. ............... 438/714 |
| 6,900,123 B2 * | 5/2005 | Jiang et al. ............... 438/636 |
| 7,015,133 B2 * | 3/2006 | Su et al. ............... 438/618 |
| 2004/0192058 A1 * | 9/2004 | Chu et al. ............... 438/710 |

* cited by examiner

*Primary Examiner*—David A. Zarneke
(74) *Attorney, Agent, or Firm*—Jacqueline J. Garner; W. James Brady, III; Frederick J. Telecky, Jr.

(57) ABSTRACT

A method includes performing a first etch process to form a via hole in a dual-damascene integrated circuit structure comprising a first dielectric layer and a second dielectric layer. The via hole extends at least substantially through the first and second dielectric layers. The method further includes filling at least a portion of the via hole with a plug material to form a plug within the via hole, and performing a second etch process through the first dielectric layer and the portion of the plug adjacent the first dielectric layer to form a trench in the first dielectric layer. The second etch process is performed using an RF power of less than 1,000 Watts and using an etching chemistry that includes $CF_4$ and $N_2$. For example, second etch process may use an etching chemistry of $CF_4/N_2/Ar$, which may additionally include one or both of CO and $O_2$.

14 Claims, 1 Drawing Sheet

LOW-K DIELECTRIC ETCH PROCESS FOR DUAL-DAMASCENE STRUCTURES

TECHNICAL FIELD OF THE INVENTION

This invention relates in general to integrated circuits and, more particularly, to a low-K dielectric etch process for dual-damascene structures.

BACKGROUND OF THE INVENTION

Interconnects are often formed in integrated circuit fabrication to connect particular elements or components of the integrated circuit and may be used, for example, to create an electrical path within an integrated circuit, such as to apply a voltage to a particular region or component of the integrated circuit. Interconnects may include one or more metal lines or wires and one or more conductive vias. Metal lines may be formed in various structural layers called metalization layers and conductive vias may be formed to connect particular elements formed in various metalization layers. For example, conductive vias are often used to connect metal lines formed in one metalization layer with metal lines formed in other metalization layers.

Metal lines and conductive vias may be formed using standard or damascene processes, such as single and dual damascene processes. In a damascene process, metal lines are deposited in trenches and/or via holes formed in one or more dielectric layers and then excess material is removed, for example, by chemical metal polish (CMP). In a certain dual damascene process used to form a conductive via and a metal line, a via hole is first etched through two dielectric layers, the via hole is plugged with a polymer material, and a trench is then formed through the top one of the two dielectric layers and the polymer material within the top dielectric layer. The via hole and trench are then filled with a conductive material to form a conductive via and a metal line, respectively. To form the trench, a trench etch process is performed, typically using a dielectric chemistry including $C_4F_8$ or $C_5F_8$ combined with Argon (and/or $O_2$ or $N_2$) at relatively high RF powers (ion energy and flux), such as in the range of 1000–2000 Watts. Such trench etch process may etch through the top dielectric layer faster than through the polymer material within the top dielectric layer. As a result, portions of the top dielectric layer around the perimeter of the polymer plug may not be removed during the trench etch process due to sidewall masking around the polymer plug. Such remaining portions of the top dielectric layer may be referred to as "crowns," "fences," or "ridges" of dielectric material. Such crowns, fences or ridges may cause poor metallization when the via hole and trench are filled with the conductive material, which may lead to decreased yield or reliability of the metal contacts.

SUMMARY OF THE INVENTION

In accordance with the present invention, a dual damascene process is provided that substantially eliminates or reduces the disadvantages and problems associated with previously-developed processes.

According to one embodiment, a method includes performing a first etch process to form a via hole in a dual-damascene integrated circuit structure comprising a first dielectric layer and a second dielectric layer. The via hole extends at least substantially through the first and seconds dielectric layers. The method further includes filling at least a portion of the via hole with a plug material to form a plug within the via hole, and performing a second etch process through the first dielectric layer and the portion of the plug adjacent the first dielectric layer to form a trench in the first dielectric layer. The second etch process is performed using an RF power of less than 1,000 Watts and using an etching chemistry that includes $CF_4$ and $N_2$. For example, second etch process may use an etching chemistry of $CF_4/N_2/Ar$, which may additionally include one or both of CO and $O_2$.

Various embodiments of the present invention may benefit from numerous technical advantages. It should be noted that one or more embodiments may benefit from some, none, or all of the advantages discussed below.

One technical advantage of the invention is that a trench etch process for forming conductive vias and metal lines is provided that reduces or eliminates the likelihood of "via ridges," "crowns," or "fences" of dielectric material remaining intact within the trench after the trench etch process. Since no ridges, crowns, or fences of dielectric remain after the trench etch process, the via hole and trench may be fully filled with a conductive material to form a conductive via and a metal line, thus resulting in better, more reliable metal contacts as compared with prior methods in which crowns, fences or ridges of dielectric material remain after the trench etch process.

Other technical advantages will be readily apparent to one having ordinary skill in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Example embodiments of the present invention and their advantages are best understood by referring now to FIGS. 1A through 1F of the drawings, in which like numerals refer to like parts.

In general, a method of forming conductive vias and metal lines using a dual damascene process is provided. A via hole is formed through two dielectric layers, the via hole is plugged with a polymer material, and a trench is then formed through the top one of the two dielectric layers. A trench is formed in the top dielectric layer using a dielectric chemistry including $CF_4/N_2$ with or without a carrier gas and/or $CO/O_2$ at a relatively low RF power (ion energy and flux), such as in the range of 300–600 Watts. In particular embodiments, a dielectric chemistry including $CF_4/N_2/Ar$ with or without one or both of CO and $O_2$ is used. In certain embodiments, the trench etch process etches through the top dielectric layer and the polymer material within the top dielectric layer at substantially the same rate, thus removing all of the top dielectric layer within the trench. Thus, no "crowns," "fences," or "ridges" of dielectric material remain within the trench. The trench and the remaining portion of the via hole (the portion within the un-etched lower dielectric layer) are then filled with a conductive material to form a conductive via and a metal line, respectively. Since no crowns, fences or ridges of dielectric material were formed within the trench, the via hole and trench may be fully filled with the conductive material, thus resulting in better, more reliable metal contacts.

Figure 1A:
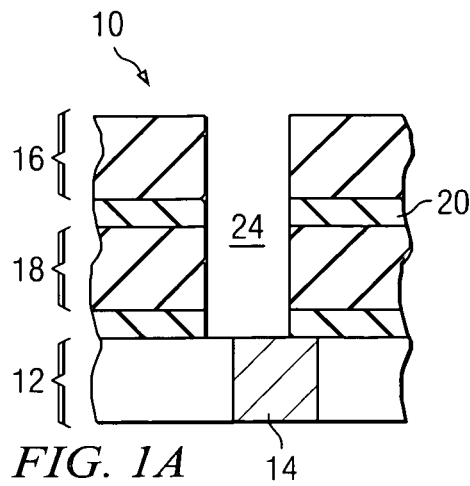
FIGS. 1A–1F illustrate a method of forming a metal line and conductive via using a dual-damascene approach according to an embodiment of the present invention.

FIGS. 1A–1F illustrate a method of forming a metal line and conductive via using a dual-damascene approach according to an embodiment of the present invention. FIG. 1A illustrates a cross-section of a dual damascene stack 10. Dual damascene stack 10 includes a first metallization layer 12 having a first metal line 14 formed therein, a first dielectric layer 16, and a second dielectric layer 18 disposed between first metallization layer 12 and first dielectric layer 16. A trench etch stop layer 20 is formed between first and second dielectric layers 16 and 18.

First metal line 14 may be formed from any suitable conductive material, such as copper or aluminum, for example. First and second dielectric layers 16 and 18 may be formed from one or more low-K dielectric materials, such as various materials having an isotropic dielectric constant, k, of less than or approximately equal to 3.0. Such low-K materials include doped oxide, organic, highly fluorinated, and porous materials, such as, for example, fluorosilicate glass (FSG), polyimides, hydrogen silsesquioxane (HSQ), B-staged polymers (CYCLOTENE™ and SiLK™), fluorinated polyimides, Teflon-AF (PTFE), porous HSQ, and porous SiLK. Trench etch stop layer 20 may be formed from any materials suitable for forming an etch stop. In some embodiments, dual damascene stack 10 may not include trench etch stop layer 20; in such cases, first and second dielectric layers 16 and 18 may be formed directly adjacent each other.

A via hole 24 is formed at least substantially through first dielectric layer 16, trench etch stop 20, and second dielectric layer 18. A via hole cleaning process may be performed to remove residue from via hole 24.

Figure 1B:
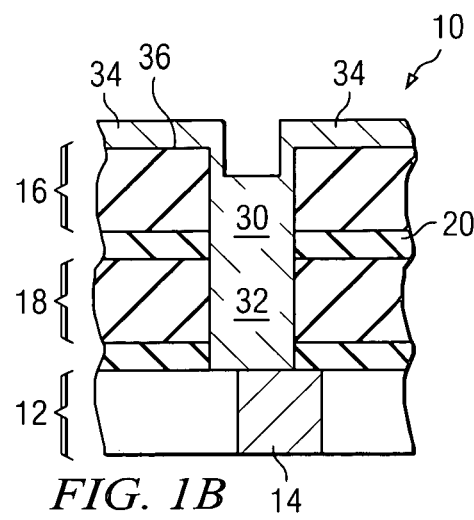

As shown in FIG. 1B, a plug 30 may be formed by depositing a plug material 32 into via hole 24. Plug material may substantially fill via hole 24, at least to a level above trench stop layer 20. In addition, a portion of the plug material 32 is deposited around the perimeter of via hole 24 to form a layer 34 of plug material 32 adjacent a first side 36 of first dielectric layer 16. Plug material 32 may comprise one or more polymers, such as one or more CH compounds, i-line resist materials, or BARC (bottom anti-reflecting coating) materials, for example.

Figure 1C:
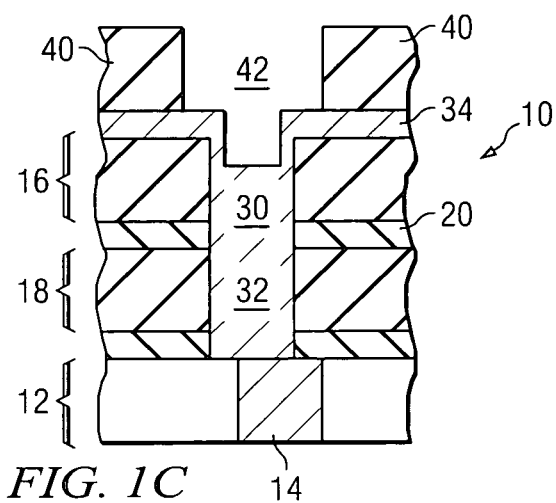

As shown in FIG. 1C, a resist layer 40 having an opening 42 may be formed adjacent layer 34 of plug material 32. Opening 42 is formed such that a portion of layer 34 of plug material 32 is exposed through opening 42. Resist layer 40 may be formed from any suitable materials for forming a photoresist.

Figure 1D:
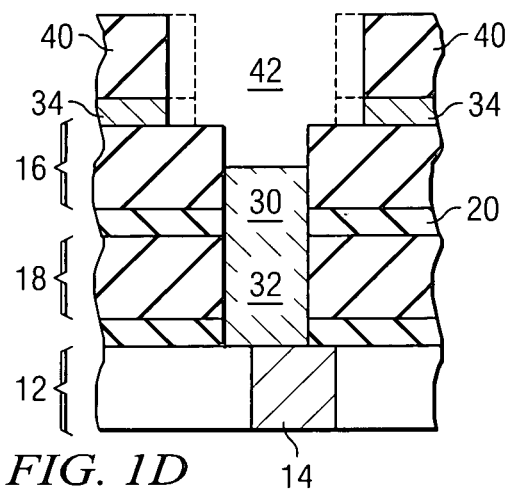

As shown in FIG. 1D, an etch process is performed through opening 42 in resist layer 40 to remove the portion of the layer 34 of plug material 32 exposed through opening 42. In addition, a portion of plug 30, as well as portions of resist layer 40 around the perimeter of opening 42 indicated by the dashed regions 44, may be removed by the etch process. The etch process may comprise a dry etch process, such as a BARC etch process for example.

Figure 1E:
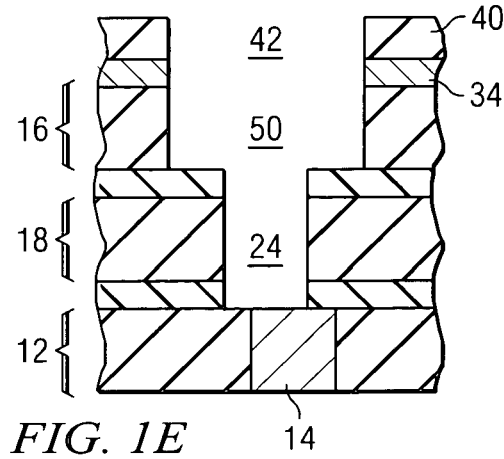

As shown in FIG. 1E, a trench etch process is performed on stack 10 to form a trench 50 in first dielectric layer 16. In certain embodiments, the trench etch process is performed using a clean dielectric chemistry including including $CF_4$, $N_2$, a carrier gas and/or one or both of CO and $O_2$ at relatively low RF powers (ion energy and flux) such that dielectric layer 16 is completely removed from trench 50. In particular, trench 50 formed using such a trench etch process is free of "via ridges" (also commonly referred to as "via fences" or "via crowns") which often remain after traditional trench etch processes, such as traditional trench etch processes using traditional chemistries (such as, for example, $C_4F_8$ or $C_5F_8$ combined with Argon and/or $O_2$ or $N_2$).

In certain embodiments, the trench etch process is performed at an RF power of less than 1,000 Watts. In particular embodiments, the trench etch process is performed at RF powers in the range of 300–600 Watts. In addition, in certain embodiments, the etch chemistry used for the trench etch includes $CF_4/N_2$/Ar with or without one or both of CO and $O_2$.

In certain embodiments of the invention, the selectivity of the trench etch process between first dielectric layer 16 and plug 30 is relatively low, and in some cases, substantially negligible. In other words, first dielectric layer 16 and plug 30 are etched at substantially the same rate, thereby reducing or eliminating the likelihood of "via ridges" remaining intact after the trench etch process.

Figure 1F:
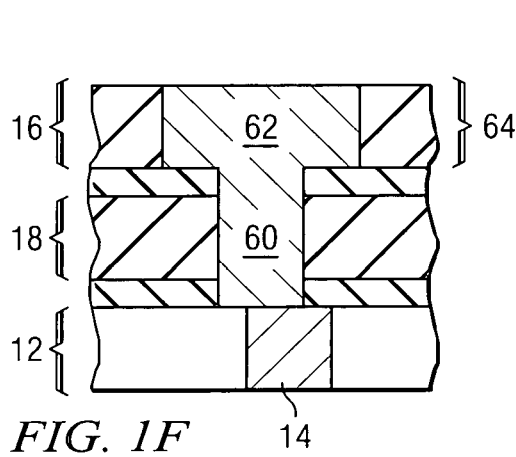

After the trench etch process, an ash process may be performed to remove portions of plug 30, resist layer 40, and layer 34 of plug material 32 remaining after the trench etch process. As shown in FIG. 1F, the remaining portion of via hole 24 (i.e., the portion of via hole 24 extending through second dielectric layer 18) and trench 50 may be filled with any suitable conductive material (such as copper or aluminum, for example) to form a conductive via 60 and a second metal line 62. The surface of stack 10 may then be cleaned to remove excess materials. For example, a chemical metal polish (CMP) may be used to remove excess conductive material that was deposited to form conductive via 60 and second metal line 62. Metal line 62 may form part of a second metallization layer 64. Thus, conductive via 60 may form a conductive path between first metal line 14 in first metallization layer 12 and second metal line 62 in second metallization layer 64.

Since no crowns, fences or ridges of dielectric material from first dielectric layer 16 remained within trench 50 after the trench etch process, via hole 24 and trench 50 may be fully filled with the conductive material to form conductive via 60 and second metal line 62, thus resulting in better, more reliable metal contacts as compared with prior methods in which crowns, fences or ridges of dielectric material remain after the trench etch process. In other words, conductive via 60 forms a reliable conductive path between first metal line 14 in first metallization layer 12 and second metal line 62 in second metallization layer 64, as compared with vias formed using prior methods.

Although an embodiment of the invention and its advantages are described in detail, a person having ordinary skill in the art could make various alternations, additions, and omissions without departing from the spirit and scope of the present invention as defined by the appended claims.

What is claimed is:

1. A method, comprising:
   performing a first etch process to form a via hole in a dual-damascene integrated circuit structure comprising a first dielectric layer and a second dielectric layer, the via hole extending at least substantially through the first dielectric layer and the second dielectric layer;
   filling at least a portion of the via hole with a plug material to form a plug within the via hole; and
   performing a second etch process through the first dielectric layer and the portion of the plug adjacent the first dielectric layer to form a trench in the first dielectric layer, the second etch process performed using an RF power of less than 1,000 Watts and using an etching chemistry that includes $CF_4$ and $N_2$ and etches the first dielectric layer and the portion of the plug at substantially the same rate.

2. The method of claim 1, wherein the trench is free of remaining portions of the first dielectric layer.

3. The method of claim 1, wherein:
the first dielectric layer comprises an oxide layer; and
the trench is free of oxide crowns.

4. The method of claim 1, wherein the second etch process is performed using an RF power in the range of 300–600 Watts.

5. The method of claim 1, wherein the etching chemistry for the second etch process includes $CF_4/N_2/Ar$.

6. The method of claim 1, wherein the etching chemistry for the second etch process further includes at least one of $O_2$ and CO.

7. The method of claim 1, wherein the plug material comprises a polymer.

8. The method of claim 1, wherein:
a layer of the plug material is deposited adjacent a first side of the first dielectric layer during the formation of the plug within the via hole;
the method further comprises:
forming a resist layer adjacent the layer of the plug material, the resist layer having an opening, at least a portion of the layer of the plug material being exposed through the opening; and
prior to performing the second etch process to form the trench, performing a third etch process through the opening in the resist layer to remove the exposed portion of the layer of the plug material.

9. The method of claim 1, wherein the first dielectric material is a low-K dielectric.

10. The method of claim 9, wherein the second dielectric material is a low-K dielectric.

11. The method of claim 1, further comprising filling the via hole and the trench with a conductive material such that the conductive material in the via forms a conductive via and the conductive material in the trench forms a metal line coupled to the conductive via.

12. The method of claim 1, wherein the dual-damascene integrated circuit structure comprises a trench etch stop layer second dielectric layers.

13. A method, comprising:
performing a first etch process to form a via hole in a dual-damascene integrated circuit structure comprising a first dielectric layer and a second dielectric layer, the via hole extending at least substantially through the first dielectric layer and the second dielectric layer;
filling at least a portion of the via hole with a plug material to form a plug within the via hole; and
performing a second etch process through the first dielectric layer and the portion of the plug adjacent the first dielectric layer to form a trench in the first dielectric layer, the second etch process performed using an RF power in the range of 300–600 Watts and using an etching chemistry that includes $CF_4$ and $N_2$.

14. A method, comprising:
performing a first etch process to form a via hole in a dual-damascene integrated circuit structure comprising a first dielectric layer and a second dielectric layer, the via hole extending at least substantially through the first dielectric layer and the second dielectric layer;
filling at least a portion of the via hole with a plug material to form a plug within the via hole; and
performing a second etch process through the first dielectric layer and the portion of the plug adjacent the first dielectric layer to form a trench in the first dielectric layer, the second etch process performed using an RF power of less than 1,000 Watts and using an etching chemistry that consists essentially of $CF_4$, Ar, $N_2$, and a gas selected from the group consisting of CO, $O_2$, or a combination thereof.

* * * * *